(12) United States Patent
Kallioinen et al.

(10) Patent No.: US 10,644,176 B2
(45) Date of Patent: May 5, 2020

(54) QUANTUM DOT PHOTODETECTOR APPARATUS AND ASSOCIATED METHODS

(71) Applicant: EMBERION OY, Espoo (FI)

(72) Inventors: Sami Seppo Antero Kallioinen, Espoo (FI); Martti Kalevi Voutilainen, Espoo (FI)

(73) Assignee: EMBERION OY, Espoo (FI)

( * ) Notice: Subject to any disclaimer, the term of this patent is extended or adjusted under 35 U.S.C. 154(b) by 74 days.

(21) Appl. No.: 15/779,213

(22) PCT Filed: Nov. 24, 2016

(86) PCT No.: PCT/EP2016/078730
§ 371 (c)(1),
(2) Date: May 25, 2018

(87) PCT Pub. No.: WO2017/093124
PCT Pub. Date: Jun. 8, 2017

(65) Prior Publication Data
US 2018/0337295 A1    Nov. 22, 2018

(30) Foreign Application Priority Data

Nov. 30, 2015 (EP) ..................... 15196932

(51) Int. Cl.
*H01L 31/00* (2006.01)
*H01L 31/0352* (2006.01)
*H01L 31/112* (2006.01)
*G01J 1/42* (2006.01)
*G01J 1/44* (2006.01)
(Continued)

(52) U.S. Cl.
CPC .... *H01L 31/035218* (2013.01); *G01J 1/4228* (2013.01); *G01J 1/44* (2013.01);
(Continued)

(58) Field of Classification Search
CPC ..... H01L 31/035209; H01L 31/035218; H01L 27/1443; G01J 1/4228; G01J 1/44
(Continued)

(56) References Cited

U.S. PATENT DOCUMENTS

| 2011/0278541 | A1 | 11/2011 | Huang et al. |
| 2014/0299741 | A1 | 10/2014 | Colli |
| 2019/0140060 | A1* | 5/2019 | Allen ............. H01L 31/022408 |

FOREIGN PATENT DOCUMENTS

| JP | 2008214363 A | 9/2008 |
| WO | WO 2008/131313 A2 | 10/2008 |

(Continued)

OTHER PUBLICATIONS

International Search Report & Written Opinion dated Feb. 2, 2017 corresponding to International Patent Application No. PCT/EP2016/078730.
(Continued)

*Primary Examiner* — Kevin K Pyo
(74) *Attorney, Agent, or Firm* — Squire Patton Boggs (US) LLP

(57) ABSTRACT

An apparatus comprising at least one pair of first and second photodetectors, each photodetector of the photodetector pair comprising a channel member, respective source and drain electrodes configured to enable a flow of electrical current through the channel member between the source and drain electrodes, and a plurality of quantum dots configured to generate electron-hole pairs on exposure to incident electromagnetic radiation to produce a detectable change in the electrical current flowing through the channel member, wherein the apparatus is configured such that the first and second photodetectors of the photodetector pair generate electron-hole pairs which produce an increase and decrease in electrical current through the channel members respectively, the combined change in electrical current of the pair
(Continued)

of first and second photodetectors being indicative of one or more of the presence and magnitude of the incident electromagnetic radiation.

16 Claims, 6 Drawing Sheets

(51) Int. Cl.
*H01L 27/144* (2006.01)
*H01L 51/42* (2006.01)
*H01L 31/18* (2006.01)

(52) U.S. Cl.
CPC ........ *H01L 27/1443* (2013.01); *H01L 31/112* (2013.01); *G01J 2001/444* (2013.01); *G01J 2001/4406* (2013.01); *H01L 31/18* (2013.01); *H01L 51/42* (2013.01)

(58) Field of Classification Search
USPC ...................................................... 250/214.1
See application file for complete search history.

(56) References Cited

FOREIGN PATENT DOCUMENTS

| WO | 2011037041 A1 | 3/2011 |
| WO | WO 2013/021095 A2 | 2/2013 |

OTHER PUBLICATIONS

European Search Report dated May 24, 2016 corresponding to European Patent Application No. 15 19 6932.

\* cited by examiner

QUANTUM DOT PHOTODETECTOR APPARATUS AND ASSOCIATED METHODS

TECHNICAL FIELD

The present disclosure relates particularly to photodetectors, associated methods and apparatus. Certain embodiments specifically concern an apparatus comprising at least one pair of first and second photodetectors each having a plurality of quantum dots configured to generate electron-hole pairs on exposure to incident electromagnetic radiation. In these embodiments, the apparatus is configured such that the first and second photodetectors generate electron-hole pairs which produce an increase and decrease in electrical current respectively, the combined change in electrical current of the pair of first and second photodetectors being indicative of one or more of the presence and magnitude of the incident electromagnetic radiation. Some embodiments may relate to portable electronic devices, in particular, so-called hand-portable electronic devices which may be hand-held in use (although they may be placed in a cradle in use). Such hand-portable electronic devices include so-called Personal Digital Assistants (PDAs) and tablet PCs.

The portable electronic devices/apparatus according to one or more disclosed example aspects/embodiments may provide one or more audio/text/video communication functions (e.g. tele-communication, video-communication, and/or text transmission, Short Message Service (SMS)/Multimedia Message Service (MMS)/emailing functions, interactive/non-interactive viewing functions (e.g. web-browsing, navigation, TV/program viewing functions), music recording/playing functions (e.g. MP3 or other format and/or (FM/AM) radio broadcast recording/playing), downloading/sending of data functions, image capture function (e.g. using a (e.g. in-built) digital camera), and gaming functions.

BACKGROUND

Research is currently being done to develop new photodetector devices.

The listing or discussion of a prior-published document or any background in this specification should not necessarily be taken as an acknowledgement that the document or background is part of the state of the art or is common general knowledge.

SUMMARY

According to a first aspect, there is provided an apparatus comprising at least one pair of first and second photodetectors,
   each photodetector of the photodetector pair comprising a channel member, respective source and drain electrodes configured to enable a flow of electrical current through the channel member between the source and drain electrodes, and a plurality of quantum dots configured to generate electron-hole pairs on exposure to incident electromagnetic radiation to produce a detectable change in the electrical current flowing through the channel member,
   wherein the apparatus is configured such that the first and second photodetectors of the photodetector pair generate electron-hole pairs which produce an increase and decrease in electrical current through the channel members respectively, the combined change in electrical current of the pair of first and second photodetectors being indicative of one or more of the presence and magnitude of the incident electromagnetic radiation.

The apparatus may be configured such that the first and second photodetectors of the photodetector pair generate electron-hole pairs which simultaneously produce an increase and decrease in electrical current through the channel members, respectively.

The plurality of quantum dots may comprise ligands attached thereto which are configured to enable the transfer of either electrons or holes of the generated electron-hole pairs to the channel member leaving the remaining charge carriers on the quantum dots to produce the detectable change in electrical current.

The first and second photodetectors of the photodetector pair may comprise similarly doped channel members, and the ligands of the first photodetector may be configured to enable the transfer of a different type of charge carrier to the respective channel member than the ligands of the second photodetector in order to produce the different changes in electrical current.

The first and second photodetectors of the photodetector pair may comprise oppositely doped channel members, and the ligands of the first photodetector may be configured to enable the transfer of the same type of charge carrier to the respective channel member as the ligands of the second photodetector in order to produce the different changes in electrical current.

The first and second photodetectors of the photodetector pair may each comprise a gate electrode configured to generate an electric field upon the application of a voltage thereto, the generated electric field enabling the transfer of either electrons or holes of the generated electron-hole pairs to the channel member leaving the remaining charge carriers on the quantum dots to produce the detectable change in electrical current.

The first and second photodetectors of the photodetector pair may comprise similarly doped channel members, and the voltage applied to the gate electrode of the first photodetector may have an opposite polarity to the voltage applied to the gate electrode of the second photodetector such that the resulting electric fields enable the transfer of different types of charge carrier to the respective channel members in order to produce the different changes in electrical current.

The first and second photodetectors of the photodetector pair may comprise oppositely doped channel members, and the voltage applied to the gate electrode of the first photodetector may have the same polarity as the voltage applied to the gate electrode of the second photodetector such that the resulting electric fields enable the transfer of the same type of charge carrier to the respective channel members in order to produce the different changes in electrical current.

The gate electrode of one or more of the first and second photodetectors of the photodetector pair may be configured such that the electric field generated by the applied voltage facilitates or inhibits the transfer of charge carriers by the ligands to the respective channel member.

The gate electrode of one or more of the first and second photodetectors of the photodetector pair may be configured such that the electric field generated by the applied voltage causes electrostatic doping of the respective channel member.

The first and second photodetectors of the photodetector pair may be arranged such that the combined change in electrical current is converted into a corresponding voltage signal.

The first and second photodetectors of the photodetector pair may be arranged to form a half-bridge circuit configured to convert the combined change in electrical current into a single-ended voltage signal.

The apparatus may comprise at least two pairs of first and second photodetectors arranged to form a full-bridge circuit configured to convert the combined change in electrical current into a differential voltage signal.

One or more of the material, size and shape of the quantum dots may be configured such that the electron-hole pairs are generated on exposure to at least one of the following types of electromagnetic radiation: x-rays, visible light, infrared, ultraviolet, radio waves, microwaves, gamma rays and thermal radiation.

The channel member of at least one photodetector may comprise one or more of a two-dimensional material, graphene, a graphene-like material and a transition metal dichalcogenide. It will be appreciated that channel members may comprise membranes/foils of nanometre thick carbon structures.

The graphene-like material may comprise one or more of graphene oxide, phosphorene, silicene, germanene, stanene, h-BN, AlN, GaN, InN, InP, InAs, BP, BAs and GaP.

The transition metal dichalcogenide may comprise one or more of $WX_2$, $MoX_2$, $ScX_2$, $TiX_2$, $HfX_2$, $ZrX_2$, $VX_2$, $CrX_2$, $MnX_2$, $FeX_2$, $CoX_2$, $NiX_2$, $NbX_2$, $TcX_2$, $ReX_2$, $PdX_2$, $PtX_2$, where X=S, Se or Te.

The quantum dots of at least one photodetector may comprise one or more of PbS, CdSe, CdS, PbSe, ZnO, ZnS, CZTS, $Cu_2S$, $Bi_2S_3$, $Ag_2S$, $Ag_2S$, HgTe, CdHgTe, InAs, InSb, Ge and CIS.

The ligands of at least one photodetector may comprise one or more of oleate, trioctylphosphine oxide, alkylphosphonic acid, fatty acid, long-chain alkylamine, 1,2-ethanedithiol, pyridine, butylamine and 1,3-benzenedithiol.

The source, drain and gate electrodes of at least one photodetector may comprise one or more of a metal, a metal nanoparticle ink, silver, gold, copper, nickel, cobalt, palladium, a conductive metal oxide, a carbon-based material, an organic material and a polymer.

The apparatus may be one or more of an electronic device, a portable electronic device, a portable telecommunications device, a mobile phone, a personal digital assistant, a tablet, a phablet, a desktop computer, a laptop computer, a server, a smartphone, a smartwatch, smart eyewear, a sensor, an x-ray sensor, and a module for one or more of the same.

According to a further aspect, there is provided a method of using an apparatus,
the apparatus comprising at least one pair of first and second photodetectors,
each photodetector of the photodetector pair comprising a channel member, respective source and drain electrodes configured to enable a flow of electrical current through the channel member between the source and drain electrodes, and a plurality of quantum dots configured to generate electron-hole pairs on exposure to incident electromagnetic radiation to produce a detectable change in the electrical current flowing through the channel member,
wherein the apparatus is configured such that the first and second photodetectors of the photodetector pair generate electron-hole pairs which produce an increase and decrease in electrical current through the channel members respectively, the combined change in electrical current of the pair of first and second photodetectors being indicative of one or more of the presence and magnitude of the incident electromagnetic radiation,
the method comprising determining one or more of the presence and magnitude of electromagnetic radiation incident upon the apparatus based on the combined change in electrical current of the pair of first and second photodetectors as a result of the incident electromagnetic radiation.

According to a further aspect, there is provided a method of making an apparatus,
the apparatus comprising at least one pair of first and second photodetectors, each photodetector of the photodetector pair comprising a channel member, respective source and drain electrodes configured to enable a flow of electrical current through the channel member between the source and drain electrodes, and a plurality of quantum dots configured to generate electron-hole pairs on exposure to incident electromagnetic radiation to produce a detectable change in the electrical current flowing through the channel member,
the method comprising configuring the apparatus such that the first and second photodetectors of the photodetector pair generate electron-hole pairs which produce an increase and decrease in electrical current through the channel members respectively, the combined change in electrical current of the pair of first and second photodetectors being indicative of one or more of the presence and magnitude of the incident electromagnetic radiation.

The method may comprise forming the at least one pair of first and second photodetectors.

The steps of any method disclosed herein do not have to be performed in the exact order disclosed, unless explicitly stated or understood by the skilled person.

Corresponding computer programs for implementing one or more steps of the methods disclosed herein are also within the present disclosure and are encompassed by one or more of the described example embodiments.

One or more of the computer programs may, when run on a computer, cause the computer to configure any apparatus, including a battery, circuit, controller, or device disclosed herein or perform any method disclosed herein. One or more of the computer programs may be software implementations, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software may be an assembly program.

One or more of the computer programs may be provided on a computer readable medium, which may be a physical computer readable medium such as a disc or a memory device, or may be embodied as a transient signal. Such a transient signal may be a network download, including an internet download.

The present disclosure includes one or more corresponding aspects, example embodiments or features in isolation or in various combinations whether or not specifically stated (including claimed) in that combination or in isolation. Corresponding means for performing one or more of the discussed functions are also within the present disclosure.

The above summary is intended to be merely exemplary and non-limiting.

BRIEF DESCRIPTION OF THE FIGURES

A description is now given, by way of example only, with reference to the accompanying drawings, in which.

DESCRIPTION OF SPECIFIC ASPECTS/EMBODIMENTS

Existing photodetector devices often suffer from a low signal-to-noise ratio and therefore require high performance amplifiers to compensate. Such amplifiers increase the cost and complexity of the circuitry and consume surface area on the chip which could otherwise be used for detection.

Figure 1:
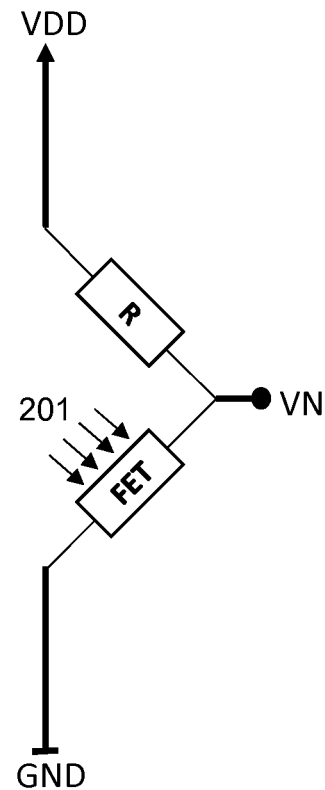
FIG. 1 shows one example of a photodetector apparatus comprising a half-bridge circuit.

FIG. 1 shows one example of an existing photodetector device comprising a resistor R and a field-effect transistor-based photodetector FET connected in series between power supply VDD and ground GND terminals. Field-effect transistors comprise source and drain electrodes configured to enable a flow of electrical current through a channel member between the source and drain electrodes, and a gate electrode configured to vary the electrical current flowing through the channel member when a voltage is applied thereto. To enable photodetection, however, the gate electrode is replaced (or supplemented) by a photosensitive material configured to produce a detectable change in the electrical current on exposure to incident electromagnetic radiation 101 which is indicative of one or more of the presence and magnitude of the incident electromagnetic radiation.

Figure 2:
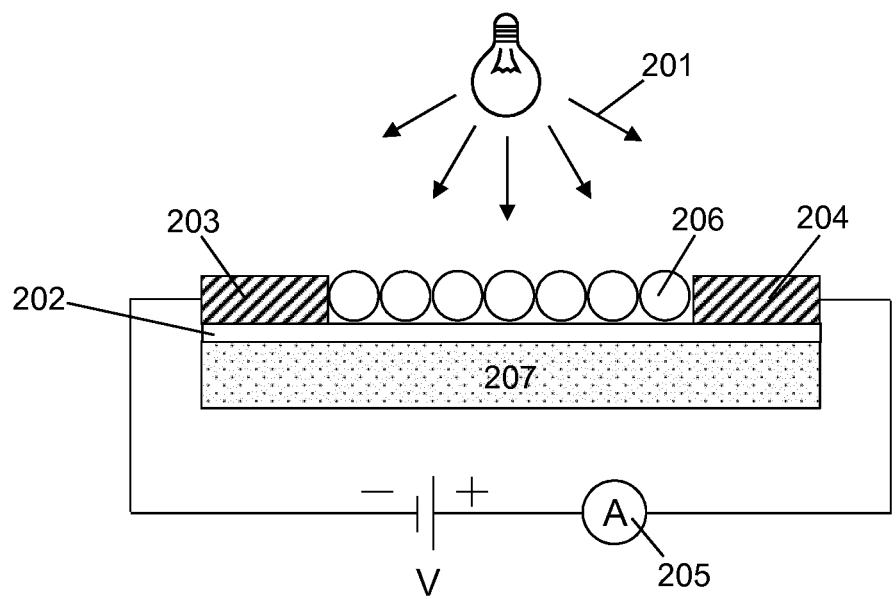
FIG. 2 shows a photodetector comprising a quantum dot field effect transistor.

FIG. 2 shows a photodetector device comprising a photosensitive material on top of the channel member 202 of the field-effect transistor (which itself is supported on a substrate 207). The device also comprises a power supply configured to apply a potential difference V between the source 203 and drain 204 electrodes, and an ammeter 205 configured to measure the electrical current flowing through the channel member 202. In this example, the photosensitive material comprises a plurality of quantum dots 206 configured to generate electron-hole pairs on exposure to the incident electromagnetic radiation 201. The apparatus is configured such that, after the generation of these electron-hole pairs, either the electrons or the holes are transferred to the channel member 202 leaving the remaining charge carriers on the quantum dots 206. These remaining charge carriers then gate the channel member 202 causing a detectable change in the current flowing therethrough.

In many cases, the output signal of the photodetector is passed to an analogue-to-digital converter (ADC) to enable subsequent digital signal processing. Since most ADCs require voltage mode signals, however, the current mode signal of the field-effect transistor (i.e. the change in electrical current flowing through the channel member 202) needs to be converted into a corresponding voltage signal VN. This is achieved by the voltage divider arrangement of the resistor R and field effect transistor FET. An alternative option is to incorporate a transimpedance amplifier, but this requires more hardware, power and surface area.

There will now be described an apparatus and associated methods that may provide a greater signal-to-noise ratio without the need for additional signal amplification.

Figure 3:
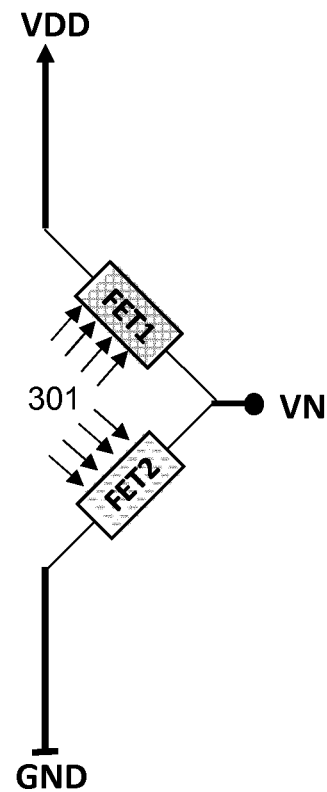
FIG. 3 shows one example of the present apparatus comprising a half-bridge circuit.

FIG. 3 shows one example of the present apparatus. The apparatus comprises at least one pair of first FET1 and second FET2 photodetectors. Each photodetector of the photodetector pair FET1,2 comprises a channel member, respective source and drain electrodes configured to enable a flow of electrical current through the channel member between the source and drain electrodes, and a plurality of quantum dots configured to generate electron-hole pairs on exposure to incident electromagnetic radiation 301 to produce a detectable change in the electrical current flowing through the channel member. Furthermore, the apparatus is configured such that the first FET1 and second FET2 photodetectors of the photodetector pair FET1,2 generate electron-hole pairs which (e.g. simultaneously) produce an increase and decrease in electrical current through the channel members respectively, the combined change in electrical current of the pair of first FET1 and second FET2 photodetectors being indicative of one or more of the presence and magnitude of the incident electromagnetic radiation 301.

Since the first photodetector FET1 exhibits an opposite optoelectronic response to the second photodetector FET2, the output signal of the present apparatus can be up to twice as large as the photodetector device of FIG. 1. Furthermore, because the second photodetector FET2 essentially replaces the resistor R of FIG. 1, and also removes the need for an additional transimpedance amplifier, a greater surface area of the apparatus may be used for detection of the incident electromagnetic radiation 301. This aspect provides for a more efficient device.

In this example, the channel member of each photodetector FET1,2 may comprise graphene. Graphene exhibits a relatively high charge carrier mobility which is particularly sensitive to the electric field generated by the gate electrode or photosensitive material. In other examples, however, the channel member of at least one photodetector FET1,2 may comprise different two-dimensional materials such as a graphene-like material (e.g. graphene oxide, phosphorene, silicone, germanene, stanine, h-BN, AlN, GaN, InN, InP, InAs, BP, BaS or GaP) or a transition metal dichalcogenide (e.g. $WX_2$, $MoX_2$, $ScX_2$, $TiX_2$, $HfX_2$, $ZrX_2$, $VX_2$, $CrX_2$, $MnX_2$, $FeX_2$, $CoX_2$, $NiX_2$, $NbX_2$, $TcX_2$, $ReX_2$, $PdX_2$ or $PtX_2$, where X=S, Se or Te). In addition, the source, drain and gate electrodes of at least one photodetector may comprise one or more of a metal, a metal nanoparticle ink, silver, gold, copper, nickel, cobalt, a conductive metal oxide, a carbon-based material, an organic material and a polymer.

There are a number of ways in which the apparatus may be configured such that the first FET1 and second FET2 photodetectors produce different changes in electrical current. For example, it may be achieved using different ligands attached to the quantum dots of the respective photodetectors FET1,2. In this example, the first FET1 and second FET2 photodetectors of the photodetector pair FET1,2 may comprise similarly doped channel members, and the ligands of the first photodetector FET1 may be configured to enable the transfer of a different type of charge carrier to the respective channel member than the ligands of the second photodetector FET2. Similarly, the first FET1 and second FET2 photodetectors of the photodetector pair FET1,2 may comprise oppositely doped channel members, and the ligands of the first photodetector FET1 may be configured to enable the transfer of the same type of charge carrier to the respective channel member as the ligands of the second photodetector FET2.

Figure 4:
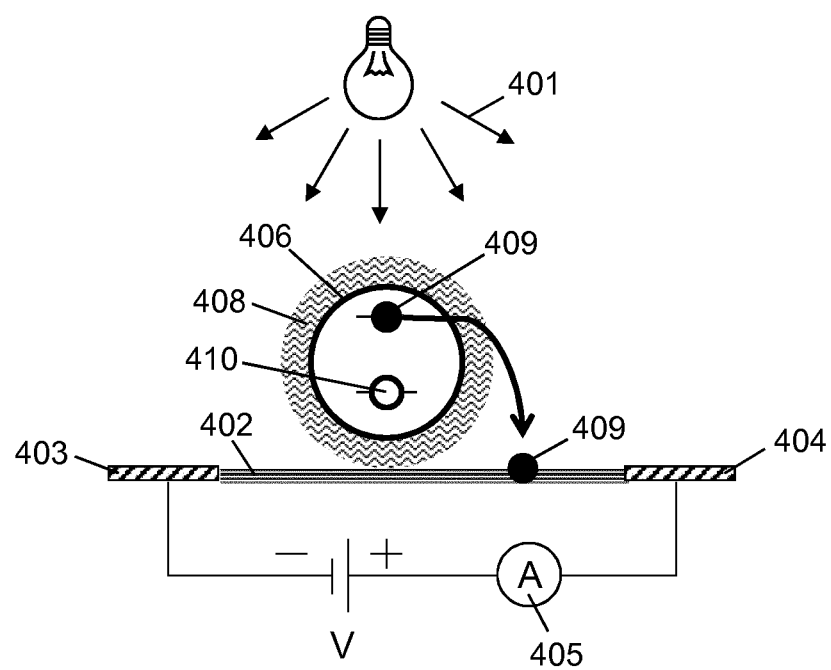
FIG. 4 shows how ligands can be used to control the transfer of charge carriers from a quantum dot to the channel member.

FIG. 4 shows how ligands 408 can be used to control the transfer of charge carriers 409 from a quantum dot 406 to the channel member 402. As can be seen in this example, the incident electromagnetic radiation 401 causes excitation of an electron 409 in the quantum dot 406 generating an electron-hole pair. In this example, the ligands 408 attached to the quantum dot 406 are configured such that the electron 409 of the electron-hole pair is able to tunnel through the ligands 408 to the channel member 402 leaving the remaining hole 410 on the quantum dot 406 to produce the detectable change in electrical current. In another example, the ligands 408 attached to the quantum dot 406 may be configured such that the hole 410 of the electron-hole pair is able to tunnel through the ligands 408 to the channel member 402 leaving the remaining electron 409 on the quantum dot 406 to produce the detectable change in electrical current. The charge transfer mechanism is not limited solely to electron/hole tunnelling, however. In some examples, thermally-activated electron/hole hopping may be used as well as or instead of electron/hole tunnelling.

When the channel member 402 is p-doped and the ligands 408 enable the transfer of electrons 409 from the quantum dot 406 to the channel member 402, the remaining holes 410 on the quantum dot 406 create a depletion region in the channel member 402 causing a decrease in the electrical current flowing therethrough. On the other hand, when the ligands 408 enable the transfer of holes 410 from the quantum dot 406 to the channel member 402, the remaining electrons 409 on the quantum dot 406 create a conductive region in the channel member 402 causing an increase in the electrical current flowing therethrough. The opposite is true when the channel member 402 is n-doped.

One or more of the material, size and shape of the quantum dots 406 may be configured such that the electron-hole pairs are generated on exposure to at least one of the following types of electromagnetic radiation 401: x-rays, visible light, infrared, ultraviolet, radio waves, microwaves, gamma rays and thermal radiation. The quantum dots 406 of at least one of the photodetectors may comprise one or more of PbS, CdSe, CdS, PbSe, ZnO, ZnS, CZTS, $Cu_2S$, $Bi_2S_3$, $Ag_2S$, $Ag_2S$, HgTe, CdHgTe, InAs, InSb, Ge and ClS, and the ligands 408 of at least one of the photodetectors may comprise one or more of oleate, trioctylphosphine oxide, alkylphosphonic acid, fatty acid, long-chain alkylamine, 1,2-ethanedithiol, pyridine, butylamine and 1,3-benzenedithiol.

The transfer of charge carriers 409, 410 is also dependent upon the band structure between the quantum dot 406 and the channel member 402, which can be affected by doping or bias voltages. In this respect, another way of configuring the apparatus such that the first and second photodetectors produce different changes in electrical current is by applying voltages of opposite polarity to respective gate electrodes of the first and second photodetectors. In this scenario, the first and second photodetectors of the photodetector pair may comprise similarly doped channel members 402, and the voltage applied to the gate electrode of the first photodetector may have an opposite polarity to the voltage applied to the gate electrode of the second photodetector. Similarly, the first and second photodetectors of the photodetector pair may comprise oppositely doped channel members 402, and the voltage applied to the gate electrode of the first photodetector may have the same polarity as the voltage applied to the gate electrode of the second photodetector.

Figure 5:
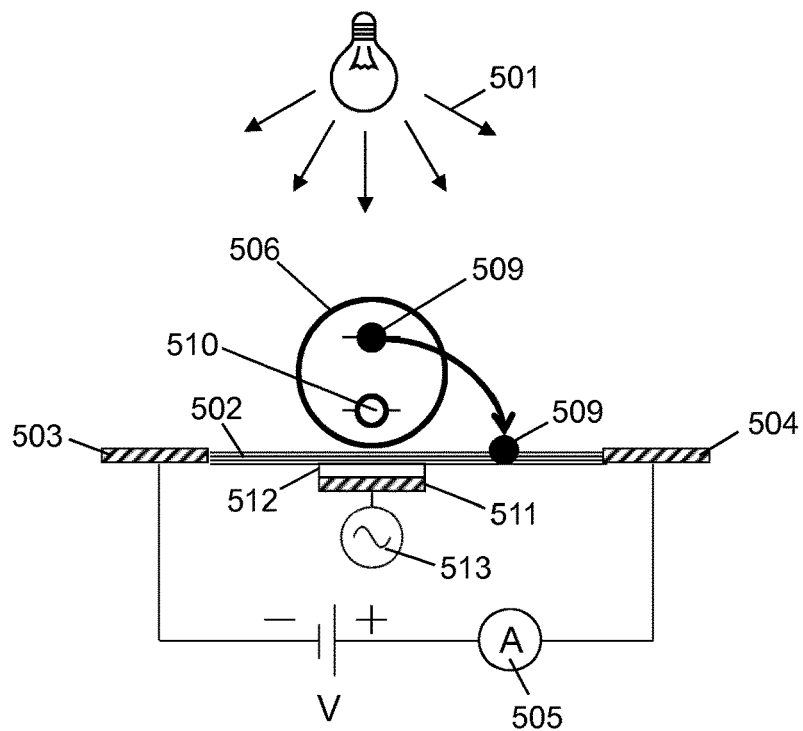
FIG. 5 shows how a gate electrode can be used to control the transfer of charge carriers from a quantum dot to the channel member.

FIG. 5 shows how a gate electrode 511 can be used to control the transfer of charge carriers 509, 510 from a quantum dot 506 to the channel member 502. As shown, the gate electrode 511 is separated from the channel member 502 by a layer of dielectric material 512 to prevent a flow of electrical current therebetween. When a voltage 513 is applied to the gate electrode 511, an electric field is produced which enables the transfer of an electron 509 or hole 510 of the generated electron-hole pair to the channel member 502 leaving the remaining charge carrier on the quantum dot 506 to produce the detectable change in electrical current. If a positive voltage is applied to the gate electrode 511, the resulting electric field enables the transfer of an electron 509 from the quantum dot 506 to the channel member 502. Similarly, if a negative voltage is applied to the gate electrode 511, the resulting electric field enables the transfer of a hole 510 from the quantum dot 506 to the channel member 502. Therefore, when the channel member 502 is p-doped and the applied voltage 513 enables the transfer of an electron 509 from the quantum dot 506 to the channel member 502, the remaining hole 510 on the quantum dot 506 creates a depletion region in the channel member 502 causing a decrease in the electrical current flowing therethrough. On the other hand, when the applied voltage 513 enables the transfer of a hole 510 from the quantum dot 506 to the channel member 502, the remaining electron 509 on the quantum dot 506 creates a conductive region in the channel member 502 causing an increase in the electrical current flowing therethrough. The opposite is true when the channel member 502 is n-doped.

Figure 6:
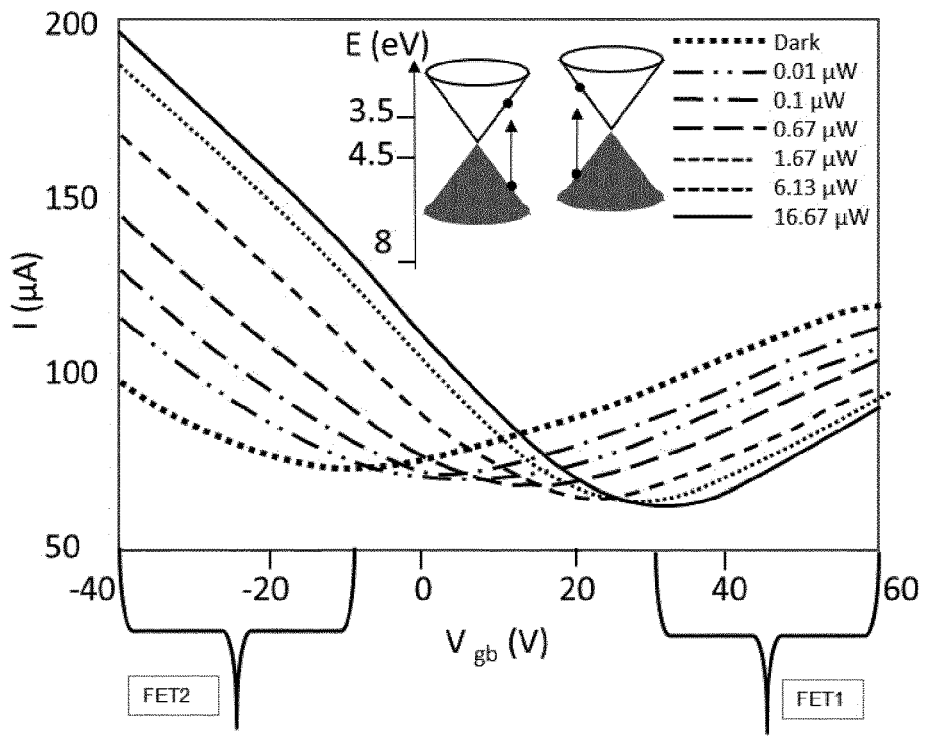
FIG. 6 shows how the optoelectronic response of a quantum dot photodetector varies with applied gate voltage.

FIG. 6 shows an example of how the optoelectronic response of a quantum dot photodetector can vary with applied gate voltage. In this example, an increase in the intensity of the incident electromagnetic radiation caused a decrease in electrical current when a negative voltage was applied to the gate electrode, and an increase in electrical current when a positive voltage was applied to the gate electrode. Therefore, if the first photodetector FET1 is biased with a positive gate voltage and the second photodetector FET2 is biased with a negative gate voltage, the incident electromagnetic radiation will cause an increase and decrease in electrical current through the associated channel members respectively.

In some cases, one or more of the first FET1 and second FET2 photodetectors may utilise ligands and a gate electrode to control the transfer of charge carriers from the quantum dots to the respective channel member. In this scenario, the electric field generated by the applied gate voltage can be used to facilitate or inhibit the transfer of charge carriers by the ligands to the respective channel member. For example, if the ligands are configured to enable the transfer of electrons to the channel member, a positive gate voltage may be used to facilitate the transfer of electrons or a negative gate voltage may be used to inhibit the transfer of electrons. In this scenario, the electric field generated by the gate voltage increases or decreases the speed of charge transfer, respectively. One reason for increasing the speed of charge transfer is to reduce the chances of electron-hole recombination within the quantum dots which would otherwise reduce the effect of the incident electromagnetic radiation on the electrical current flowing through the channel member. Increasing the speed of charge transfer therefore improves the sensitivity of the apparatus.

In some cases, the channel member of one or more of the first FET1 and second FET2 photodetectors of the photodetector pair FET1,2 may be chemically doped with impurities. Additionally or alternatively, the gate electrode of one or more of the first FET1 and second FET2 photodetectors may be configured such that the electric field generated by the applied gate voltage causes electrostatic doping of the respective channel member. For example, a positive gate voltage can be used to transfer holes from an undoped channel member to the quantum dots leaving the electrons of the electron-hole pairs in the channel member (i.e. n-doped channel), whilst a negative gate voltage can be used to transfer electrons from an undoped channel member to the quantum dots leaving the holes of the electron-hole pairs in the channel member (i.e. p-doped channel). In these cases, therefore, the gate electrode may be used to control the transfer of charge carriers both to and from the channel member.

Figure 7:
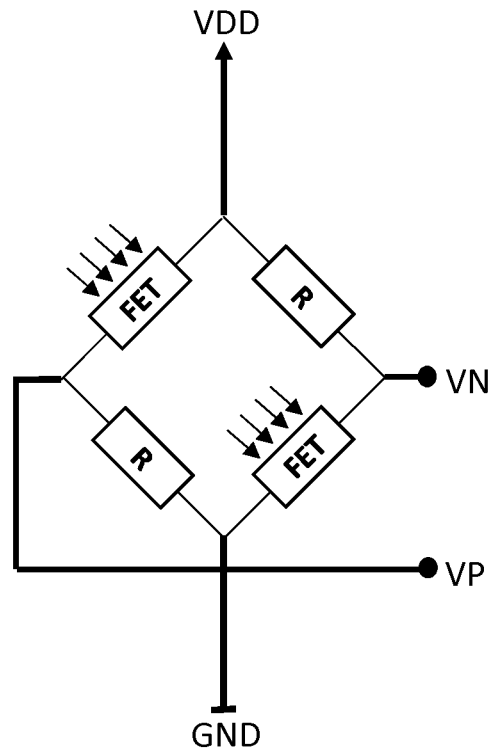
FIG. 7 shows one example of a photodetector apparatus comprising a full-bridge circuit.

FIG. 7 shows another example of a photodetector device. Unlike the examples shown in FIGS. 1 and 3 which comprise a half-bridge circuit configured to convert the change in electrical current into a corresponding single-ended voltage signal, the photodetectors FET and resistors R are arranged to form a full-bridge circuit configured to convert the change in electrical current into a differential voltage signal VN, VP. Differential signals VN, VP tend to be less sensitive to supply interference and common mode noise, which results in a greater signal-to-noise ratio.

Figure 8:
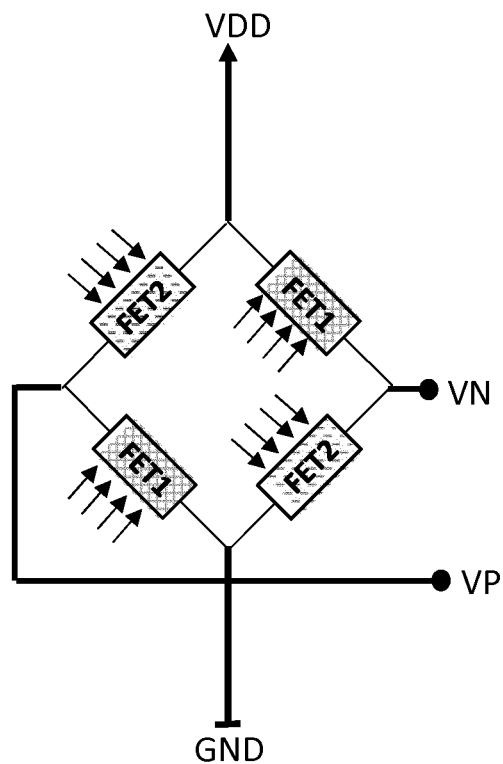
FIG. 8 shows one example of the present apparatus comprising a full-bridge circuit.

FIG. 8 shows another example of the present apparatus. In this example, the resistors R of FIG. 7 are replaced with photodetectors FET1 configured to provide an opposite response to the incident electromagnetic radiation than the existing photodetectors FET2. The full-bridge circuit of FIG. 8 therefore comprises two pairs of first FET1 and second FET2 photodetectors, but it could be extended to include one or more further photodetector pairs FET1,2.

Figure 9:
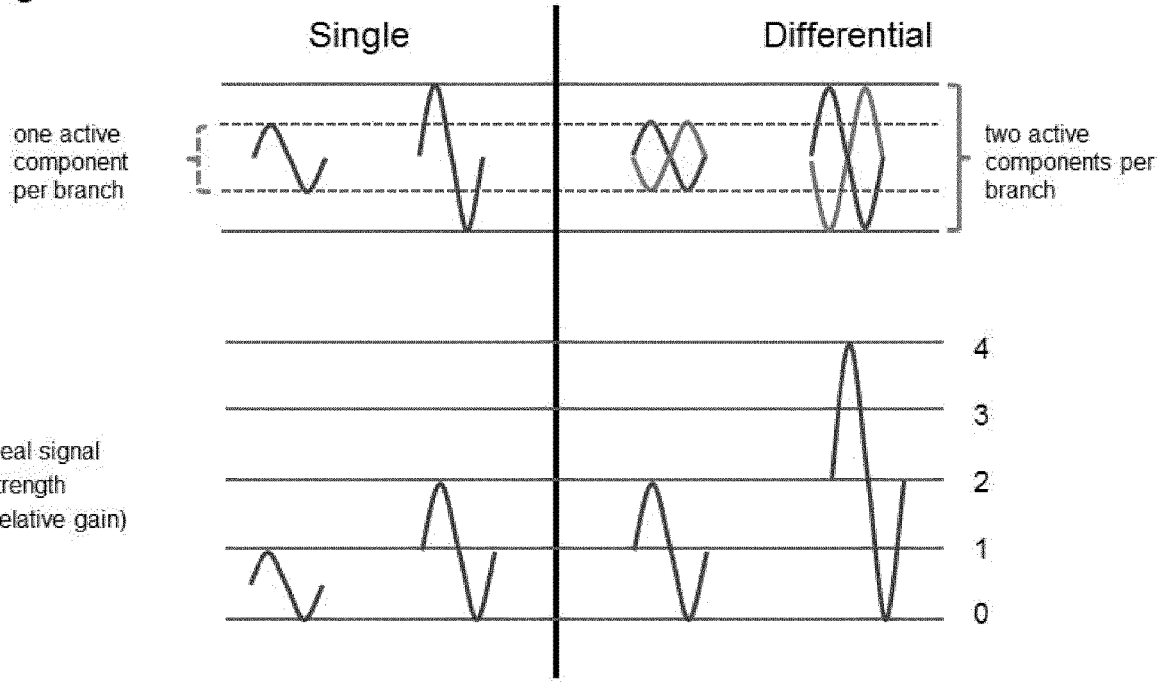
FIG. 9 shows example voltage output signals for the apparatus illustrated in FIGS. 1, 3, 7 and 8.

FIG. 9 shows example voltage output signals for the apparatus illustrated in FIGS. 1, 3, 7 and 8 (respectively from left to right). The left-hand side of the figure shows the single-ended voltage output signals for the half-bridge circuits and the right-hand side of the figure shows the differential voltage output signals for the full-bridge circuits. As shown, the magnitude of the output signal (and therefore the gain) increases with the number of photodetectors (active components) per branch.

Figure 10:
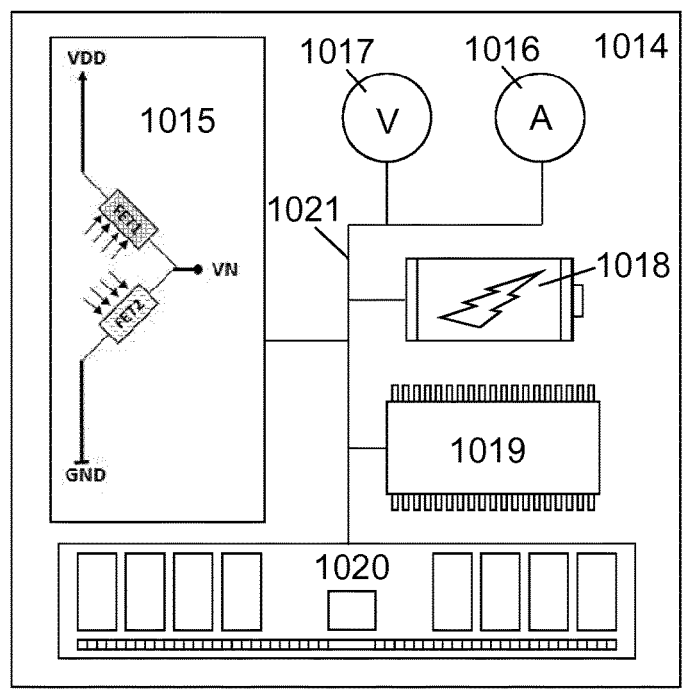
FIG. 10 shows another example of the present apparatus.

FIG. 10 shows another example of the present apparatus 1014. The apparatus 1014 may be one or more of an electronic device, a portable electronic device, a portable telecommunications device, a mobile phone, a personal digital assistant, a tablet, a phablet, a desktop computer, a laptop computer, a server, a smartphone, a smartwatch, smart eyewear, a sensor, an x-ray sensor, and a module for one or more of the same. In the example shown, the apparatus 1014 comprises the various components described previously (denoted collectively by reference numeral 1015), an ammeter 1016, a voltmeter 1017, a power supply 1018, a processor 1019 and a storage medium 1020, which are electrically connected to one another by a data bus 1021.

The processor 1019 is configured for general operation of the apparatus 1014 by providing signalling to, and receiving signalling from, the other components to manage their operation. The storage medium 1020 is configured to store computer code configured to perform, control or enable operation of the apparatus 1014. The storage medium 1020 may also be configured to store settings for the other components. The processor 1019 may access the storage medium 1020 to retrieve the component settings in order to manage the operation of the other components.

Under the control of the processor 1019, the power supply 1018 is configured to apply a voltage between the source and drain electrodes of each photodetector to enable a flow of electrical current through the respective channel member. In addition, the power supply 1018 may be configured to apply a further voltage to the gate electrode to control the transfer of charge carriers between the quantum dots and channel member.

The ammeter 1016 is configured to measure the electrical current through the channel members of the respective photodetectors so that any changes in current caused by the incident electromagnetic radiation can be determined. Additionally or alternatively, the voltmeter 1017 is configured to measure the voltage signal corresponding to the combined change in electrical current.

Based on the combined change in electrical current of the first and second photodetectors, or the corresponding voltage signal, the processor 1019 is configured to determine one or more of the presence and magnitude of the incident electromagnetic radiation. In order to determine the presence/magnitude of the incident electromagnetic radiation, the processor 1019 may use predetermined calibration data saved in the storage medium 1020 which correlates the intensity of the electromagnetic radiation with the combined change in current or the corresponding voltage signal.

The processor 1019 may be a microprocessor, including an Application Specific Integrated Circuit (ASIC). The storage medium 1020 may be a temporary storage medium such as a volatile random access memory. On the other hand, the storage medium 1020 may be a permanent storage medium such as a hard disk drive, a flash memory, or a non-volatile random access memory. The power supply 1018 may comprise one or more of a primary battery, a secondary battery, a capacitor, a supercapacitor and a battery-capacitor hybrid.

Figure 11:
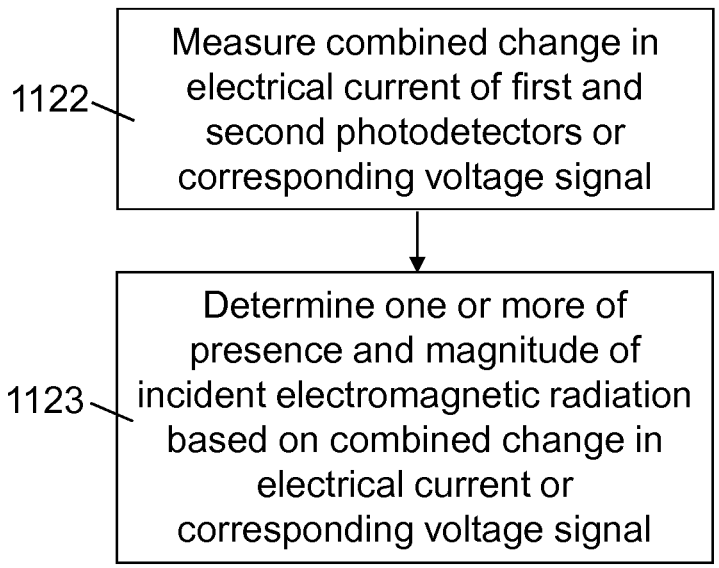
FIG. 11 shows a method of using the present apparatus.

FIG. 11 shows schematically the main steps 1122-1123 of a method of using the present apparatus. The method generally comprises: measuring the combined change in electrical current of the first and second photodetectors or the corresponding voltage signal 1122; and determining one or more of the presence and magnitude of the incident electromagnetic radiation based on the combined change in electrical current or corresponding voltage signal 1123.

Figure 12:
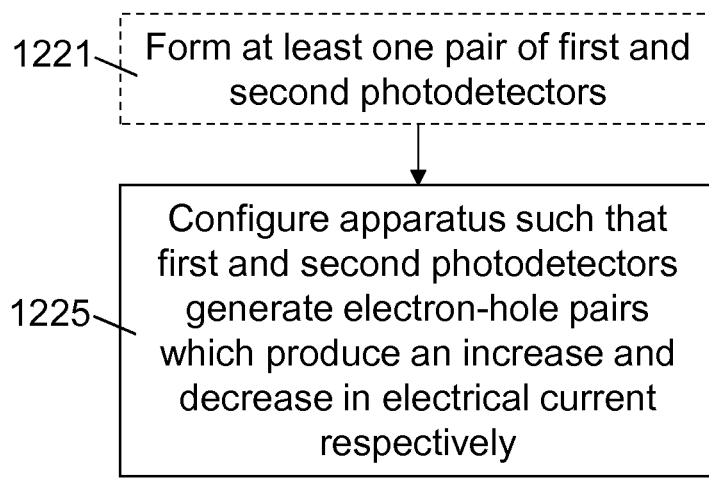
FIG. 12 shows a method of making the present apparatus.

FIG. 12 shows schematically the main steps 1224-1225 of a method of making the present apparatus. The method generally comprises: forming at least one pair of first and second photodetectors 1224; and configuring the apparatus such that the first and second photodetectors generate electron-hole pairs which produce an increase and decrease in electrical current, respectively 1225. As indicated by the dashed box, step 1224 may be performed separately from step 1225 and is therefore optional.

Figure 13:
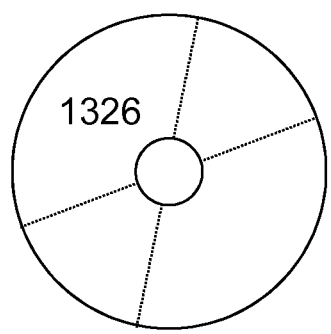
FIG. 13 shows a computer-readable medium comprising a computer program configured to perform, control or enable a method described herein.

FIG. 13 illustrates schematically a computer/processor readable medium 1326 providing a computer program according to one embodiment. The computer program may comprise computer code configured to perform, control or enable one or more of the method steps 1122-1225 of FIG. 11 or 12. In this example, the computer/processor readable medium 1326 is a disc such as a digital versatile disc (DVD) or a compact disc (CD). In other embodiments, the computer/processor readable medium 1326 may be any medium that has been programmed in such a way as to carry out an inventive function. The computer/processor readable medium 1326 may be a removable memory device such as a memory stick or memory card (SD, mini SD, micro SD or nano SD).

Other embodiments depicted in the figures have been provided with reference numerals that correspond to similar features of earlier described embodiments. For example, feature number 1 can also correspond to numbers 101, 201, 301 etc. These numbered features may appear in the figures but may not have been directly referred to within the description of these particular embodiments. These have still been provided in the figures to aid understanding of the further embodiments, particularly in relation to the features of similar earlier described embodiments.

It will be appreciated to the skilled reader that any mentioned apparatus/device and/or other features of particular mentioned apparatus/device may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some embodiments, a particular mentioned apparatus/device may be pre-programmed with the appropriate software to carry out desired operations, and wherein the appropriate software can be enabled for use by a user downloading a "key", for example, to unlock/enable the software and its associated functionality. Advantages associated with such embodiments can include a reduced requirement to download data when further functionality is required for a device, and this can be useful in examples where a device is perceived to have sufficient capacity to store such pre-programmed software for functionality that may not be enabled by a user.

It will be appreciated that any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

It will be appreciated that any "computer" described herein can comprise a collection of one or more individual processors/processing elements that may or may not be located on the same circuit board, or the same region/position of a circuit board or even the same device. In some embodiments one or more of any mentioned processors may be distributed over a plurality of devices. The same or different processor/processing elements may perform one or more functions described herein.

It will be appreciated that the term "signalling" may refer to one or more signals transmitted as a series of transmitted and/or received signals. The series of signals may comprise one, two, three, four or even more individual signal components or distinct signals to make up said signalling. Some or all of these individual signals may be transmitted/received simultaneously, in sequence, and/or such that they temporally overlap one another.

With reference to any discussion of any mentioned computer and/or processor and memory (e.g. including ROM, CD-ROM etc), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/embodiments may consist of any such individual feature or combination of features. In view of the foregoing description it will be evident to a person skilled in the art that various modifications may be made within the scope of the disclosure.

While there have been shown and described and pointed out fundamental novel features as applied to different embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment may be incorporated in any other disclosed or described or suggested form or embodiment as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. An apparatus comprising at least one pair of first and second photodetectors,
   each photodetector of the photodetector pair comprising a channel member, respective source and drain electrodes configured to enable a flow of electrical current through the channel member between the source and drain electrodes, and a plurality of quantum dots configured to generate electron-hole pairs on exposure to incident electromagnetic radiation to produce a detectable change in the electrical current flowing through the channel member,
   wherein the apparatus is configured such that the first and second photodetectors of the photodetector pair generate electron-hole pairs which produce an increase and decrease in electrical current through the channel members respectively, the combined change in electrical current of the pair of first and second photodetectors being indicative of one or more of the presence and magnitude of the incident electromagnetic radiation, and wherein the first and second photodetectors of the photodetector pair are arranged such that the combined change in electrical current is converted into a corresponding voltage signal.

2. The apparatus of claim 1, wherein the plurality of quantum dots comprise ligands attached thereto which are configured to enable the transfer of either electrons or holes of the generated electron-hole pairs to the channel member leaving the remaining charge carriers on the quantum dots to produce the detectable change in electrical current.

3. The apparatus of claim 2, wherein the first and second photodetectors of the photodetector pair comprise similarly doped channel members, and wherein the ligands of the first photodetector are configured to enable the transfer of a different type of charge carrier to the respective channel member than the ligands of the second photodetector in order to produce the different changes in electrical current.

4. The apparatus of claim 2, wherein the first and second photodetectors of the photodetector pair comprise oppositely doped channel members, and wherein the ligands of the first photodetector are configured to enable the transfer of the same type of charge carrier to the respective channel member as the ligands of the second photodetector in order to produce the different changes in electrical current.

5. The apparatus of claim 1, wherein the first and second photodetectors of the photodetector pair each comprise a gate electrode configured to generate an electric field upon the application of a voltage thereto, the generated electric field enabling the transfer of either electrons or holes of the generated electron-hole pairs to the channel member leaving the remaining charge carriers on the quantum dots to produce the detectable change in electrical current.

6. The apparatus of claim 5, wherein the first and second photodetectors of the photodetector pair comprise similarly doped channel members, and wherein the voltage applied to the gate electrode of the first photodetector has an opposite polarity to the voltage applied to the gate electrode of the second photodetector such that the resulting electric fields enable the transfer of different types of charge carrier to the respective channel members in order to produce the different changes in electrical current.

7. The apparatus of claim 5, wherein the first and second photodetectors of the photodetector pair comprise oppositely doped channel members, and wherein the voltage applied to the gate electrode of the first photodetector has the same polarity as the voltage applied to the gate electrode of the second photodetector such that the resulting electric fields enable the transfer of the same type of charge carrier to the respective channel members in order to produce the different changes in electrical current.

8. The apparatus of claim 5, wherein the plurality of quantum dots comprise ligands attached thereto which are configured to enable the transfer of either electrons or holes of the generated electron-hole pairs to the channel member leaving the remaining charge carriers on the quantum dots to produce the detectable change in electrical current, and wherein the gate electrode of one or more of the first and second photodetectors of the photodetector pair is configured such that the electric field generated by the applied voltage facilitates or inhibits the transfer of charge carriers by the ligands to the respective channel member.

9. The apparatus of claim 5, wherein the gate electrode of one or more of the first and second photodetectors of the photodetector pair is configured such that the electric field generated by the applied voltage causes electrostatic doping of the respective channel member.

10. The apparatus of claim 1, wherein the first and second photodetectors of the photodetector pair are arranged to form a half-bridge circuit configured to convert the combined change in electrical current into a single-ended voltage signal.

11. The apparatus of claim 1, wherein the apparatus comprises at least two pairs of first and second photodetectors arranged to form a full-bridge circuit configured to convert the combined change in electrical current into a differential voltage signal.

12. The apparatus of claim 1, wherein the apparatus is configured such that the first and second photodetectors of the photodetector pair generate electron-hole pairs which simultaneously produce an increase and decrease in electrical current through the channel members, respectively.

13. A method of using an apparatus,
the apparatus comprising at least one pair of first and second photodetectors,
each photodetector of the photodetector pair comprising a channel member, respective source and drain electrodes configured to enable a flow of electrical current through the channel member between the source and drain electrodes, and a plurality of quantum dots configured to generate electron-hole pairs on exposure to incident electromagnetic radiation to produce a detectable change in the electrical current flowing through the channel member,
wherein the apparatus is configured such that the first and second photodetectors of the photodetector pair generate electron-hole pairs which produce an increase and decrease in electrical current through the channel members respectively, the combined change in electrical current of the pair of first and second photodetectors being indicative of one or more of the presence and magnitude of the incident electromagnetic radiation,
the method comprising determining one or more of the presence and magnitude of electromagnetic radiation incident upon the apparatus based on the combined change in electrical current of the pair of first and second photodetectors as a result of the incident electromagnetic radiation, and
wherein the first and second photodetectors of the photodetector pair are arranged such that the combined change in electrical current is converted into a corresponding voltage signal.

14. A method of making an apparatus,
the apparatus comprising at least one pair of first and second photodetectors, each photodetector of the photodetector pair comprising a channel member, respective source and drain electrodes configured to enable a flow of electrical current through the channel member between the source and drain electrodes, and a plurality of quantum dots configured to generate electron-hole pairs on exposure to incident electromagnetic radiation to produce a detectable change in the electrical current flowing through the channel member,
the method comprising configuring the apparatus such that the first and second photodetectors of the photodetector pair generate electron-hole pairs which produce an increase and decrease in electrical current through the channel members respectively, the combined change in electrical current of the pair of first and second photodetectors being indicative of one or more of the presence and magnitude of the incident electromagnetic radiation, and wherein the first and second photodetectors of the photodetector pair are arranged such that the combined change in electrical current is converted into a corresponding voltage signal.

15. A computer program embodied on a non-transitory computer-readable medium comprising computer code configured to perform the method of claim 13.

16. A computer program embodied on a non-transitory computer-readable medium comprising computer code configured to perform the method of claim 14.

* * * * *